(12) United States Patent
Noordman et al.

(10) Patent No.: US 7,683,300 B2
(45) Date of Patent: Mar. 23, 2010

(54) USING AN INTERFEROMETER AS A HIGH SPEED VARIABLE ATTENUATOR

(75) Inventors: Oscar Franciscus Jozephus Noordman, Eindhoven (NL); Justin L. Kreuzer, Trumbull, CT (US)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 47 days.

(21) Appl. No.: 11/581,786

(22) Filed: Oct. 17, 2006

(65) Prior Publication Data

US 2008/0117494 A1    May 22, 2008

(51) Int. Cl.
  *G01J 1/32* (2006.01)
  *G02B 26/00* (2006.01)
  *G02F 1/33* (2006.01)
  *G03B 27/74* (2006.01)

(52) U.S. Cl. .................. 250/205; 359/291; 359/308; 355/68

(58) Field of Classification Search .................. 250/205, 250/237 G, 550, 201.1, 201.2, 201.3, 201.4, 250/201.8, 201.9, 204, 559.49; 398/85; 359/569, 359/583, 584, 497, 499, 291, 308, 247; 358/60; 355/67, 69, 66, 68; 327/308, 520; 385/27, 385/140, 37
See application file for complete search history.

(56) References Cited

U.S. PATENT DOCUMENTS

| 4,145,712 | A | * | 3/1979 | Spooner et al. ............. 348/757 |
| 4,327,966 | A | * | 5/1982 | Bloom ........................ 359/569 |
| 5,229,872 | A | | 7/1993 | Mumola |
| 5,296,891 | A | | 3/1994 | Vogt et al. |
| 5,500,736 | A | | 3/1996 | Koitabashi et al. |
| 5,523,193 | A | | 6/1996 | Nelson |
| 5,530,482 | A | | 6/1996 | Gove et al. |
| 5,579,147 | A | | 11/1996 | Mori et al. |
| 5,659,412 | A | * | 8/1997 | Hakki ........................ 398/152 |
| 5,677,703 | A | | 10/1997 | Bhuva et al. |
| 5,808,797 | A | | 9/1998 | Bloom et al. |
| 5,900,983 | A | * | 5/1999 | Ford et al. .................. 359/627 |
| 5,982,553 | A | | 11/1999 | Bloom et al. |
| 6,020,964 | A | | 2/2000 | Loopstra et al. |
| 6,133,986 | A | | 10/2000 | Johnson |
| 6,177,980 | B1 | | 1/2001 | Johnson |

(Continued)

FOREIGN PATENT DOCUMENTS

EP    1 580 603 A2    9/2005

(Continued)

OTHER PUBLICATIONS

First Office Action for Chinese Application No. 200710162679.4 mailed Jan. 16, 2009, 6 pgs.

(Continued)

*Primary Examiner*—Georgia Y Epps
*Assistant Examiner*—Don Williams
(74) *Attorney, Agent, or Firm*—Sterne, Kessler, Goldstein & Fox P.L.L.C.

(57) ABSTRACT

A system and method provides high speed variable attenuators. The attenuators can be used within a lithographic apparatus to control intensity of radiation in one or more correction pulses used to correct a dose of the radiation following an initial pulse of radiation.

30 Claims, 11 Drawing Sheets

U.S. PATENT DOCUMENTS

| | | |
|---|---|---|
| 6,426,830 B1 * | 7/2002 | Robinson .................... 359/308 |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 7,145,640 B2 * | 12/2006 | Voorma et al. ................. 355/69 |
| 7,170,587 B2 * | 1/2007 | Dierichs et al. ............... 355/71 |
| 2003/0053750 A1 * | 3/2003 | Yang et al. .................... 385/27 |
| 2003/0067591 A1 * | 4/2003 | Komatsuda ................... 355/67 |
| 2003/0190121 A1 * | 10/2003 | Luo et al. ..................... 385/37 |
| 2004/0041104 A1 | 3/2004 | Liebregts et al. |
| 2004/0130561 A1 | 7/2004 | Jain |
| 2005/0007572 A1 | 1/2005 | George et al. |
| 2005/0201754 A1 * | 9/2005 | Fujita et al. ................... 398/85 |
| 2005/0206869 A1 * | 9/2005 | Voorma et al. ................ 355/67 |
| 2005/0248771 A1 | 11/2005 | Eussen et al. |
| 2006/0044653 A1 | 3/2006 | Stolk |
| 2007/0047081 A1 * | 3/2007 | Hodgson et al. ............ 359/499 |
| 2007/0222961 A1 | 9/2007 | Schmidt |
| 2008/0106717 A1 * | 5/2008 | Noordman et al. ............ 355/66 |

FOREIGN PATENT DOCUMENTS

| | | |
|---|---|---|
| JP | 5-251310 A | 9/1993 |
| WO | WO 98/33096 | 7/1998 |
| WO | WO 98/38597 | 9/1998 |

OTHER PUBLICATIONS

Search Report and Written Examination Report for Singapore Application No. 200716829-7 mailed May 11, 2009, 6 pgs.

Non-Final Rejection mailed Oct. 19, 2009 for U.S. Appl. No. 11/866,820, 14 pgs.

* cited by examiner

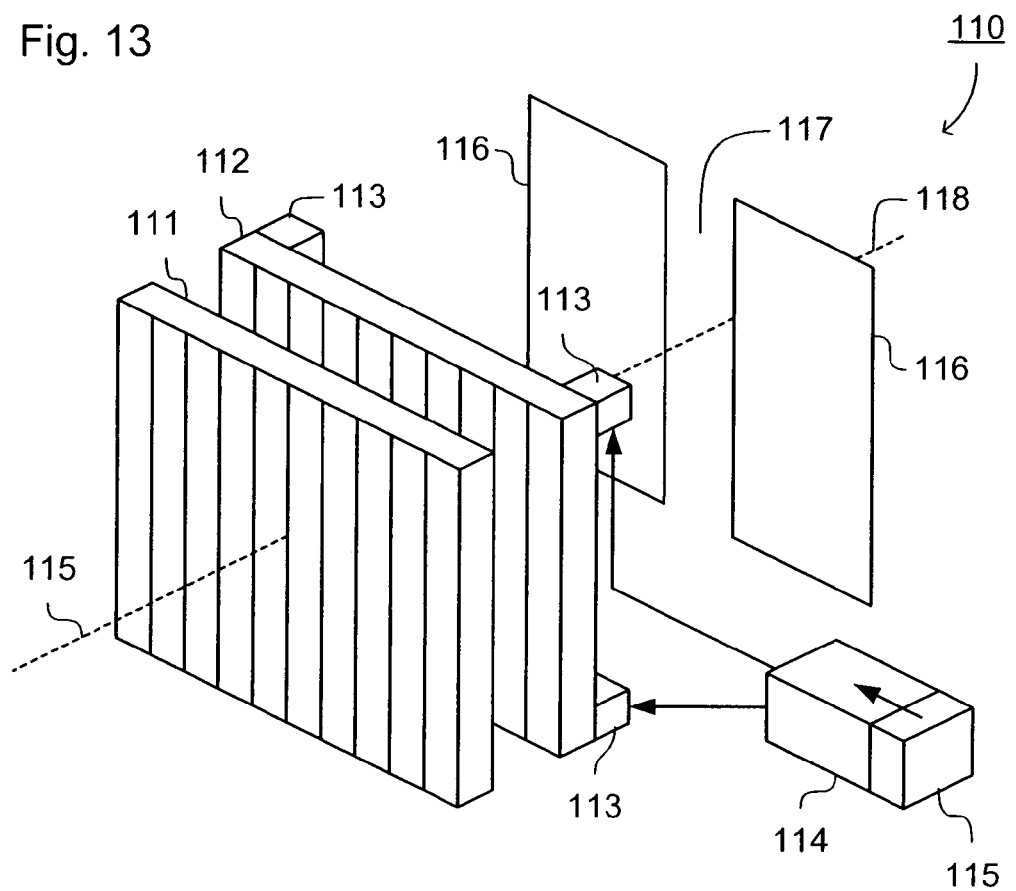

USING AN INTERFEROMETER AS A HIGH SPEED VARIABLE ATTENUATOR

BACKGROUND

1. Field of the Invention

The present invention relates to a variable attenuator, a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

The radiation sources typically used with a lithographic apparatus include pulsed laser sources. Typically, for mask-based lithographic apparatus, excimer lasers are used and several tens of laser pulses are used to expose each pattern on a part of a substrate. A problem with excimer lasers is that there is a random variation of the pulse energy of plus or minus 10% of the intended energy for each pulse. However, by using a fast control algorithm and the fact that the exposure dose on the substrate is typically made up from 40 to 60 pulses, the variation of the energy dose received at the substrate is typically of the order of plus or minus 0.1% or below.

In a maskless apparatus, the pattern set by the patterning device can be imaged onto the substrate using a single pulse of the radiation system. This is because the size of the image projected onto the substrates at any one instant is relatively small and in order to provide an adequate throughput of substrate through the lithographic apparatus. However, for a single pulse, as discussed above, the energy variation can be plus or minus 10%. Such a variation in the energy of the pulse results in an unacceptably high variation in the line width produced on the substrate.

In order to provide the required radiation dose control, it has been proposed for maskless lithographic systems to employ an arrangement in which the total dose of radiation is comprised of a main pulse and one or more correction pulses. In such an arrangement, the main pulse provides the large majority of the dose of radiation. The energy within the pulse of radiation is measured and it is subsequently determined how much additional radiation is required to provide the required dose. A correction pulse is then provided in which the radiation source is set to provide a second full pulse, but the pulse is passed through a variable attenuator that is set to reduce the energy within the pulse to the required level.

For example, the main pulse can provide 90% of the dose required. Accordingly, for the correction pulse, the attenuator is set to reduce the energy in the correction pulse, such that it only transmits the energy required to complete the dose of radiation. If the radiation source generates pulses that nominally provide 90% of the total dose required, the attenuator is set for the correction pulse to only pass one ninth of the pulse of radiation, e.g., to provide the final 10% of the required dose.

Such an arrangement can allow for the energy within the main pulse to be accurately measured. The attenuator can be set to pass accurately a requisite portion of the correction pulse. However, the potential error in the dose provided by the correction pulse (which originates from the variation in the energy in the pulses generated by the radiation source) is also reduced by the attenuator. Accordingly, the overall accuracy of the dose is improved.

A further improvement can be provided, for example, by utilizing a third correction pulse in which the intensity is further attenuated. For example, the main pulse can nominally provide 90% of the dose, the first correction pulse can nominally provide 9% of the dose and the second correction pulse can nominally provide 1% of the required dose. Such an arrangement can provide a dose accuracy that is one hundred times better than the dose accuracy of the radiation source.

However, for such an arrangement to be usable within a lithographic apparatus, the variable attenuator must meet high performance criteria. Firstly, the variable attenuator must be capable of being set very accurately to given levels of transmission. Secondly, the variable attenuator must be able to switch between different transmission levels very quickly (the time between successive pulses can be of the order of 166 µs). Thirdly, the variable attenuator should be switchable between a relatively high level of transmission and a relatively low level of transmission. Fourthly, the variable attenuator must be able to operate stably for as long a product lifetime as possible. Finally, the variable attenuator must be able to meet these performance criteria for radiation at the wavelength to be used in the lithographic process. A variable attenuator that meets these performance criteria is not presently known.

Therefore, what is needed is a system and method for providing a variable attenuator that meets the performance criteria necessary for use in a subsystem of a lithographic apparatus used to control the dose of radiation in a lithographic exposure process.

SUMMARY

In one embodiment of the present invention, there is provided a variable attenuator configured to adjust its level of transmission to an input beam of radiation in response to an input control signal, which represents a desired level of transmission of the variable attenuator to the beam of radiation. The variable attenuator comprises first and second semi-transparent reflectors and an actuator systems. The first and second semi-transparent reflectors are arranged substantially mutually parallel, such that the beam of radiation successively passes through the first and second semi-transparent reflectors. The actuator system is configured to control the separation of the first and second semi-transparent reflectors in response to the input control signal.

In another embodiment of the present invention, there is provided a variable attenuator configured to adjust its level of transmission to an input beam of radiation in response to an input control signal, which represents a desired level of transmission of the variable attenuator to the beam of radiation. The variable attenuator comprises a radiation beam splitter, a radiation beam combiner, radiation beam pathlength controller. The radiation beam splitter divides the beam of radiation into first and second radiation beam paths. The radiation beam combiner re-combines radiation from the first and second radiation beam paths, such that it interferes and produces an output beam of radiation. The radiation beam pathlength controller is configured to control the pathlength of the first radiation beam path in response to the input control signal in order to control the interference of the radiation from the first and second radiation beam paths.

In an further embodiment of the present invention, there is provided a variable attenuator configured to adjust its level of transmission to an input beam of radiation in response to an input control signal, which represents a desired level of transmission of the variable attenuator to the beam of radiation. The variable attenuator comprises first and second phase gratings and an actuator system. The first and second phase gratings are arranged substantially mutually parallel. The beam of radiation is initially incident on the first phase grating, and after passing through the first phase grating, is incident on the second phase grating. Each of the phase gratings comprises a plurality of regions of a first type and a plurality of regions of a second type. The phase gratings are constructed such that, for each phase grating, the phase shift introduced to radiation passing through the regions of the first type is a quarter of the wavelength of the beam of radiation input to the variable attenuator greater or less than for the regions of the second type. The actuator system is configured to adjust the relative positions of the first and second phase gratings in response to the input control signal at least between a first position and a second position. In the first position, radiation passing through regions of the first and second type of the first phase grating subsequently passes through regions of the first and second type, respectively, of the second phase grating. In the second position, radiation passing through regions of the first and second type of the first grating subsequently passes through regions of the second and first type, respectively, of the second phase grating.

In one embodiment there is provided a lithographic apparatus incorporating a variable attenuator such as discussed above.

In a yet further embodiment there is provided a device manufacturing method, comprising the following steps. Modulating a pulsed beam of radiation and projecting it onto a substrate. The intensity of at least one pulse of the pulsed beam of radiation is, prior to being modulated, attenuated by a variable attenuator configured to adjust its level of transmission to an input beam of radiation in response to an input control signal, which represents a desired level of transmission of the variable attenuator to the beam of radiation. The variable attenuator comprises first and second semi-transparent reflectors that are arranged substantially mutually parallel. The beam of radiation successively passes through the first and second semi-transparent reflectors. The method further comprises controlling the separation of the first and second semi-transparent reflectors in response to the input control signal.

In a yet another embodiment, there is provided a device manufacturing method, comprising the following steps. Modulating a pulsed beam of radiation and projecting it onto a substrate. The intensity of at least one pulse of the pulsed beam of radiation is, prior to being modulated, attenuated by a variable attenuator configured to adjust its level of transmission to an input beam of radiation in response to an input control signal which represents a desired level of transmission of the variable attenuator to the beam of radiation. The variable attenuator comprises a radiation beam splitter that divides the beam of radiation into first and second radiation beam paths and a radiation beam combiner that re-combines radiation from the first and second radiation beam paths such that it interferes and produces an output beam of radiation. The method comprises using a radiation beam pathlength controller to control the pathlength of the first radiation beam path in response to the input control signal in order to control the interference of the radiation from the first and second radiation beam paths.

In a yet still further embodiment, there is provided a device manufacturing method comprising the following steps. Modulating a pulsed beam of radiation and projecting it onto a substrate. The intensity of at least one pulse of the pulsed beam of radiation is, prior to being modulated, attenuated by a variable attenuator configured to adjust its level of transmission to an input beam of radiation in response to an input control signal, which represents a desired level of transmission of the variable attenuator to the beam of radiation. The variable attenuator comprises first and second phase gratings, arranged substantially mutually parallel, such that the beam of radiation is initially incident on the first phase grating and, having passed through the first phase grating, is incident on the second phase grating. Each of the phase gratings comprises a plurality of regions of a first type and a plurality of regions of a second type. The phase gratings are constructed such that, for each phase grating, the phase shift introduced to radiation passing through the regions of the first type is a quarter of the wavelength of the beam of radiation input to the variable attenuator greater than for the regions of the second type. The method further comprises adjusting the relative positions of the first and second phase gratings in response to the input control signal at least between a first position and a second position. In the first position, radiation passing through regions of the first and second type of the first phase rating subsequently passes through regions of the first and second type, respectively, of the second phase grating. In the second position, radiation passing through regions of the first and second type of the first grating subsequently passes through regions of the second and first type, respectively, of the second phase grating.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIG. 13 depicts a sixth embodiment of a variable, according to the present invention within a lithographic apparatus.

Figure 1:
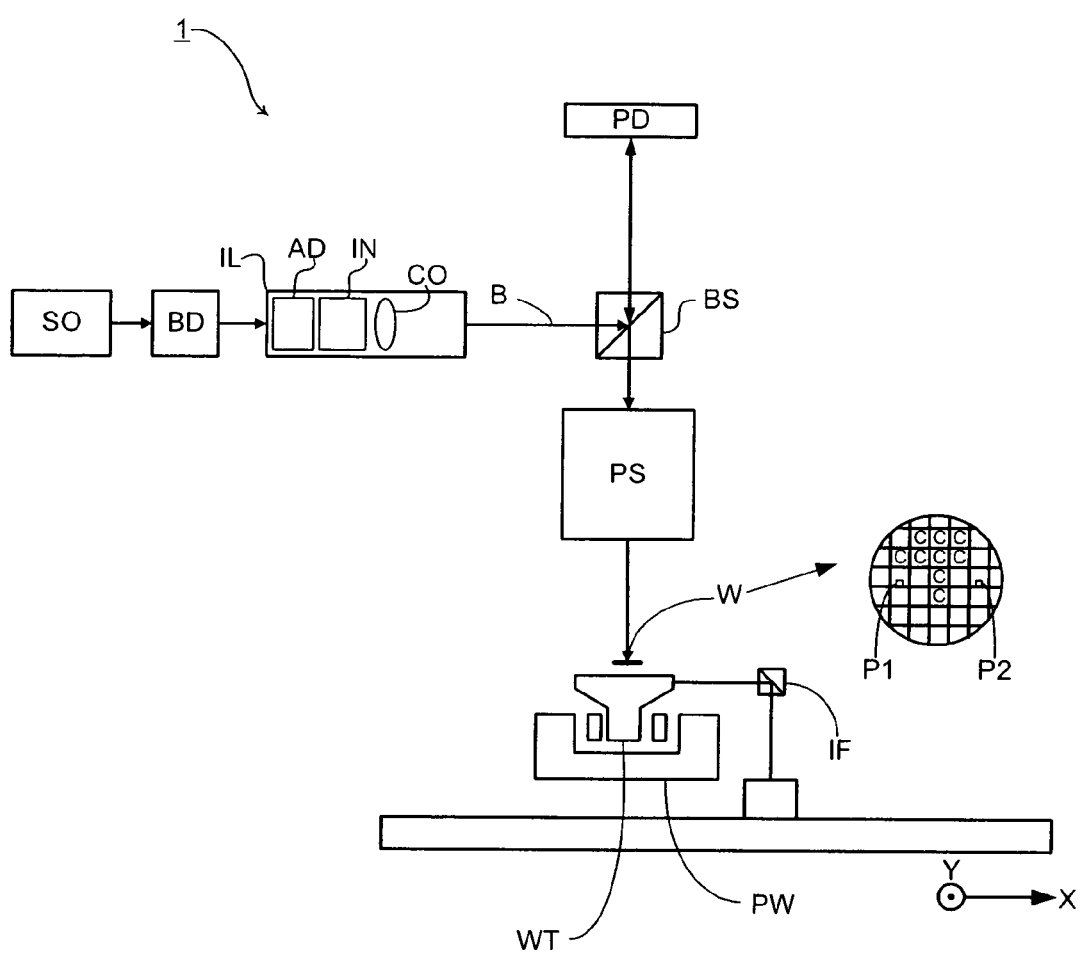
FIGS. 1 and 2 depict lithographic apparatus, according to various embodiments of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SIC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate can be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
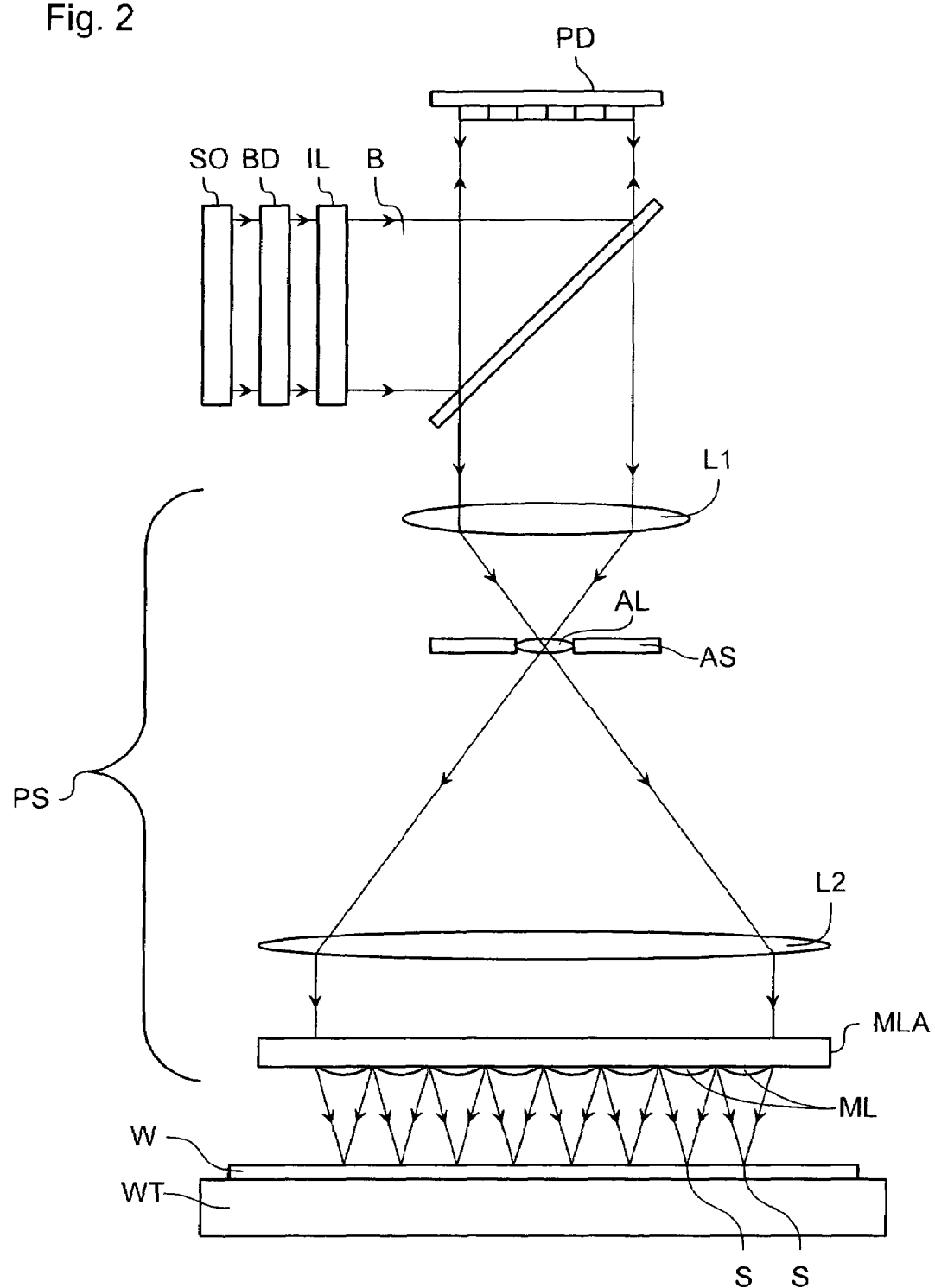

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
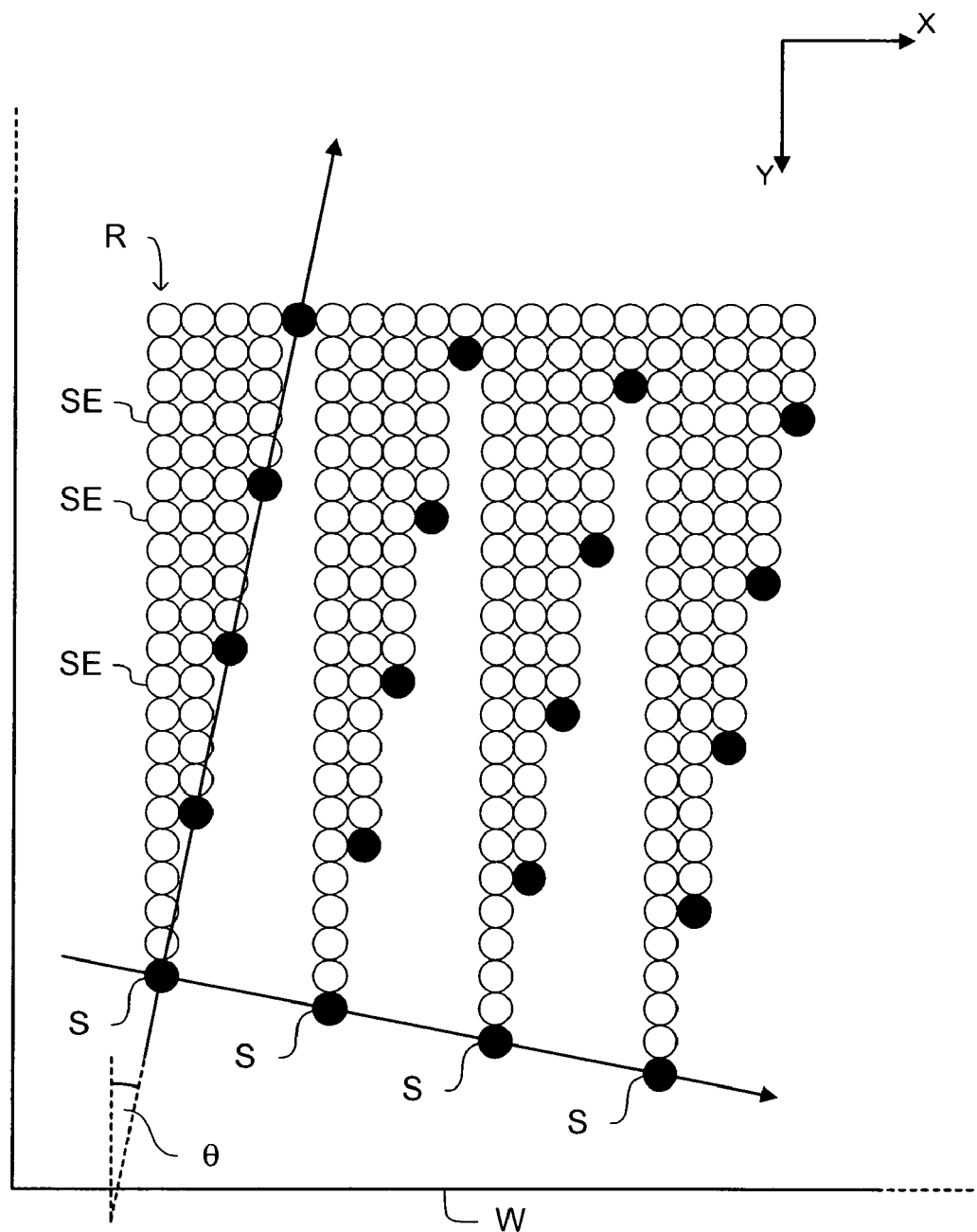
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle θ can be at most 20°, at most 10°, at most 5°, at most 3°, at most 1°, at most 0.5°, at most 0.25°, at most 0.10°, at most 0.05°, or at most 0.01°. Alternatively, the angle θ is at least 0.001°.

Figure 4:
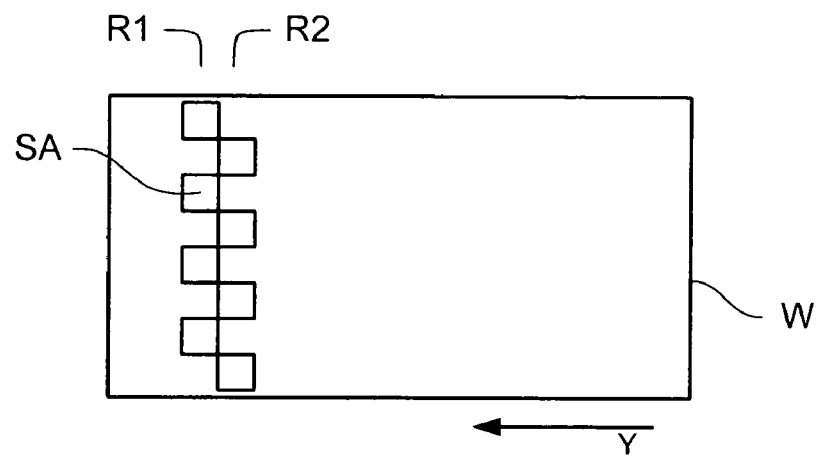
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
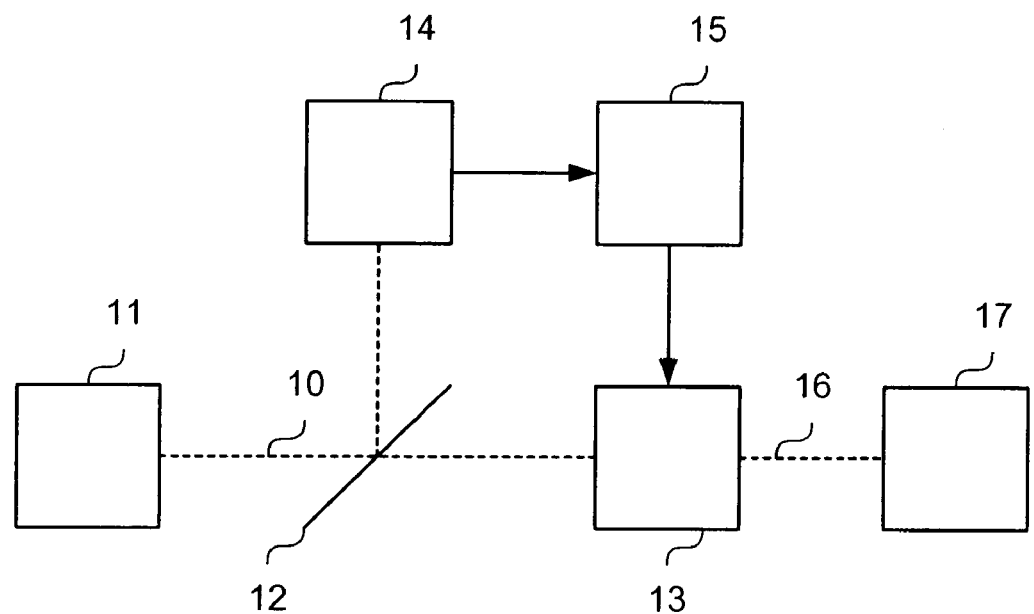
FIG. 5 depicts the use of a variable attenuator, according to the present invention within a lithographic apparatus.

FIG. 5 depicts an arrangement in which a variable attenuator can be used as part of a radiation dose control system within a lithographic apparatus. As shown, a beam of radiation 10, is provided by, for example, an illumination system 11. The beam of radiation passes through a partial reflector 12, which permits the majority of the beam of radiation to pass to the variable attenuator 13, but which diverts a portion of the beam of radiation to a radiation detector 14. As discussed above, the illumination system provides a pulsed beam of radiation 10 and the detector 14 is configured to determine the energy within each pulse of radiation. It will be appreciated that the detector 14 will be calibrated, such that from the portion of the pulsed beam of radiation 10 that is diverted to the detector 14, it can determine the energy within each pulse that is transmitted to the variable attenuator 13. A dose controller 15 is provided that provides a control signal to the variable attenuator 13 to set the level of transmission of the variable attenuator 13 to the beam of radiation that is input to it. The beam of radiation 16, output from the variable attenuator 13 and attenuated by it in accordance with the control signal from the dose controller 15, subsequently passes to the remainder of the lithographic apparatus and can, for example, be modulated by an array of individually controllable elements 17.

As discussed above, the radiation dose control system can be arranged such that a first pulse of radiation is transmitted through the system largely unattenuated and provides the large majority of the radiation dose required. The radiation detector 14 determines the energy within that first pulse and the dose controller 15 determines the energy required in the subsequent correction pulse. The controller 15 sets the variable attenuator 13 such that its level of transmission is at the requisite level to attenuate the subsequent pulse of radiation to the required level. If required, this process can be repeated for additional correction pulses.

It should be appreciated that variations of the arrangement depicted in FIG. 5 can be used. For example, the dose control system can be provided prior to the illumination system, e.g., between the radiation source and the illumination system that conditions the beam of radiation. In addition, the radiation detector 14 and the partial reflector 12 can be arranged to determine the energy within a pulse of radiation after it has been attenuated by the variable attenuator 13 (e.g., the partial reflector can be arranged to divert a portion of the beam of radiation 16 that is output from the variable attenuator to the radiation detector 14). Such an arrangement may be better able to compensate for any errors in the control of the variable attenuator 13. It will further be appreciated that the radiation detector 14 can be a simple photodiode and the calibration functions and an integration function necessary to determine the total energy within a pulse of radiation (rather than simply the intensity of the radiation at a given time within the pulse) can be provided by the dose controller 15. It should further be appreciated that the variable attenuator 13 of the present invention can be used for applications other than the one illustrated in FIG. 5.

Embodiment 1

Figure 6:
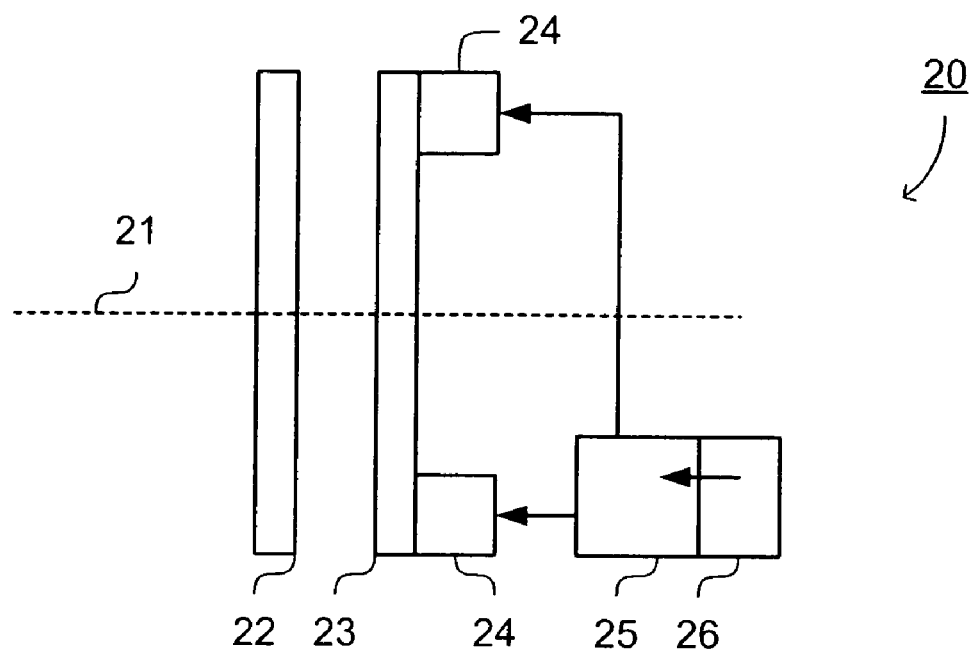
FIGS. 6 and 7 depict a first embodiment of variable attenuator, according to the present invention.

FIG. 6 depicts a variable attenuator 20 according to the first embodiment of the present invention for controlling the intensity of a beam of radiation 21. The variable attenuator includes a pair of partial reflectors 22, 23. The partial reflectors 22, 23 are arranged parallel to each other and are set at a distance apart from each other. The separation is controlled by a system of actuators 24 that are controlled by a controller 25.

Interference of the radiation reflected between the partial reflectors 22, 23 affects the level of transmission T of the variable attenuator. If:

the spacing between the surfaces of the partial reflectors 22, 23 is L
the reflection coefficient of the partial reflectors 22, 23 is R
the wavelength of the radiation is $\lambda$
and the angle of incidence of the light on the mirror is $\theta$
then $$T = \frac{(1-R)^2}{1+R^2 - 2R\cos(\delta)}, \text{ with } \delta = \left(\frac{2\pi}{\lambda}\right) 2L\cos(\theta)$$

Accordingly, by relative movement of the two partial reflectors 22, 23 of an order of magnitude of the wavelength of the radiation, the level of transmission of the variable attenuator can be switched between a maximum and a minimum and to any value in between. Therefore, the actuator system can be comprised of, for example, one or more piezoelectric actuators that are capable of adjusting the relative position of the first and second partial reflectors 22, 23 to a high accuracy over the required range of movement very quickly.

In general, the range of values of the level of transmission that can be generated by the variable attenuator is determined by the reflection coefficient of the partial reflectors R. For high values of R, the transmission-separation curve becomes very sharp, enabling larger changes in the level of transmission T for a smaller relative movement of the partial reflectors 22, 23, but equally increasing the sensitivity of the level of transmission T to position errors of the mirrors. Higher values of the coefficient of the mirrors R also results in a variable attenuator that can attain lower minimum levels of transmission T. This is important because the lower the minimum level of transmission attainable by the variable attenuator, the greater the final accuracy of the total dose of radiation provided.

Figure 7:
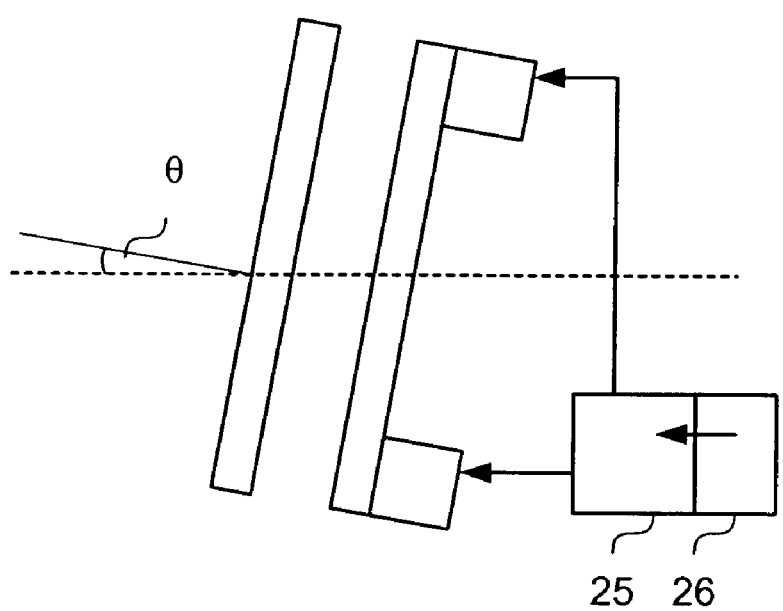

FIG. 7 shows a variation of the arrangement depicted in FIG. 6. In this case, the partial reflectors are arranged such that the beam of radiation is incident on the partial reflectors at a small angle $\theta$. An advantage of directing the beam of radiation onto the partial reflectors at a small angle is that radiation reflected by the partial reflectors is not returned to the radiation source. The angle of incidence $\theta$ is selected to be sufficient to prevent such back reflections or reduce them to an allowable level. However, as the angle of incidence $\theta$ increases, the sensitivity of the level of transmission of the variable attenuator to variations in the relative angle of the two partial reflectors (which should ideally be perfectly parallel) increases. In addition, the attainable contrast of the variable attenuator can be reduced because the beam of radiation does not precisely interfere with itself but with a slightly shifted copy. Both of these effects can be reduced by minimizing the angle of incidence $\theta$ and by minimizing the separation L.

Accurate control of the relative position of the two partial reflectors is essential to provide accurate control of the level of transmission of the variable attenuator. Accordingly, the controller 25 can include a memory 26 that stores calibration data, for example relating to the achieved level of transmission of the variable attenuator to the control signals provided to the actuator system 24.

Embodiment 2

Figure 8:
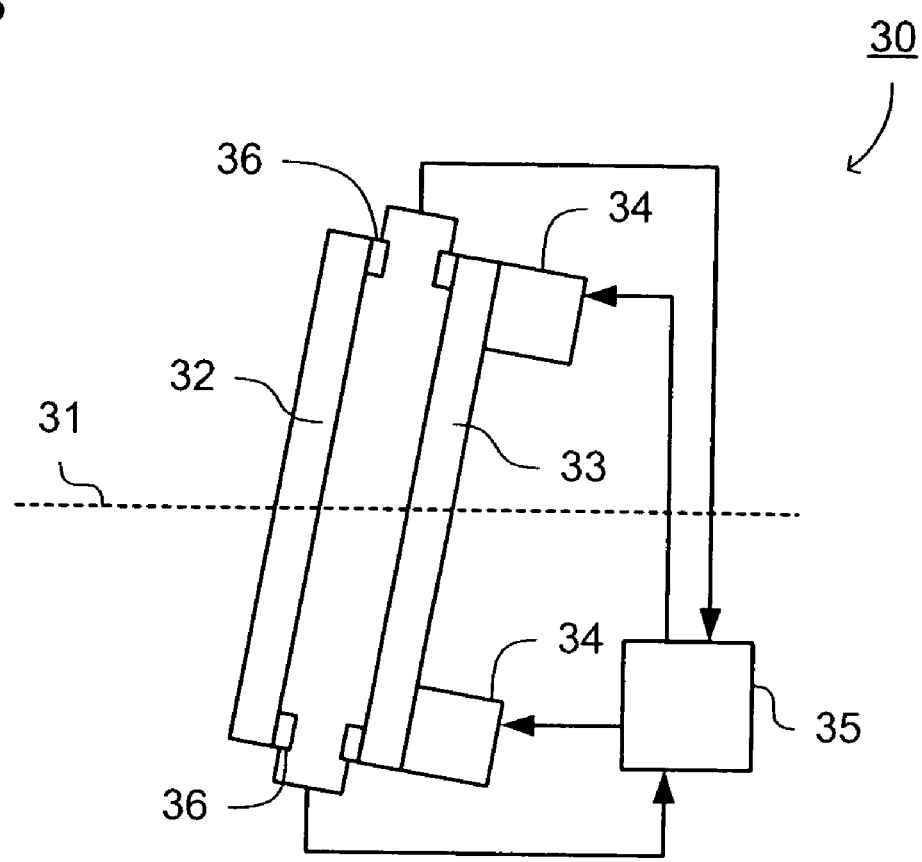
FIG. 8 depicts a second embodiment of a variable attenuator, according to the present invention.

FIG. 8 depicts an arrangement of The variable attenuator of a second embodiment of the present invention. The second embodiment corresponds to the first embodiment as depicted in FIGS. 6 and 7, but differs in the control of the actuator system 34 used to control the relative position of the partial reflectors 32, 33. In this case, position sensors 36 are used to measure the relative position of the two partial reflectors 32, 33. The position sensors can, for example, be capacitive sensors. The position sensor 36 can be arranged simply to provide a measurement of the separation L between the surfaces of the partial reflectors 32, 33. However, by provision of two or more position sensors, it also becomes possible to measure the relative angle between the surfaces. Accordingly, the controller 35 may not only adjust the separation L of the partial reflectors 32, 33 in order to control the transmission level of the variable attenuator, but can also control the actuator 34 in order to adjust the relative angle between the partial reflectors 32, 33, improving, for example, the uniformity of the intensity of the radiation across the output beam of radiation 37.

The controller 35 can be provided with a feedback system such that, for example, it determines a desired relative position of the partial reflectors 32, 33 in order to provide a given level of transmission of the variable attenuator, determines a difference between the desired relative position and a measured relative position provided by the position sensors 36, and provides the control signals to the actuator system 34 necessary to reduce the difference. Such an arrangement can require less calibration in order to provide accurate transmission control despite mechanical and thermal drifts of the components and hysteresis and creep of the piezoelectric actuator system.

Embodiment 3

Figure 9A:
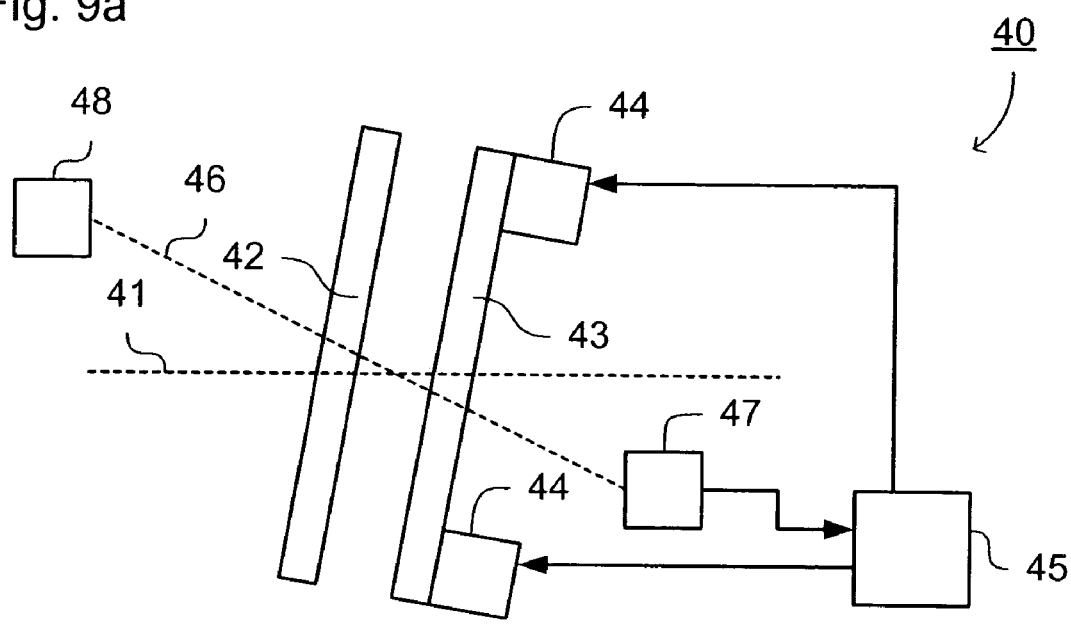
FIG. 9a depicts a third embodiment of a variable attenuator, according to the present invention.

FIG. 9a depicts a third embodiment of the present invention. Again, the variable attenuator 40 of the third embodiment operates on the same principle as the first and second embodiments, but differs in the control of the relative position of the two partial reflectors 42, 43. In this case, a second beam of radiation 46 is passed through the partial reflectors 42, 43 at a different angle of incidence to that of the beam of radiation 41 that is to be controlled. The second beam of radiation 46 is also attenuated by the variable attenuator, and subsequently inspected by a radiation detector 47. The second beam of radiation 46 can be provided by a source 48 that generates a beam of radiation at a different wavelength from the wavelength of the beam of radiation 41 to be controlled. Likewise, it need not provide the same intensity, and for practical reasons probably would not. Accordingly, because the requirements for the radiation source 48 for the second beam of radiation 46 are relatively low, it can be mounted within the variable attenuator. Alternatively, the radiation source 48 can be mounted external to the variable attenuator 40, and can even be external to a lithographic apparatus within which the variable attenuator is used. In any case, the radiation detector 47 is configured to detect the intensity of the radiation of the second beam of radiation 46 after it has been attenuated by the partial reflectors 42, 43 of the variable attenuator. Accordingly, the controller 45 can directly determine the level of transmission of the variable attenuator to the second beam of radiation 46.

It should be appreciated that if the accuracy of the control of the intensity of the second beam of radiation is not sufficiently high, a second radiation detector can be provided in association with a partial reflector prior to the second beam of radiation 46 passing through the partial reflectors 42, 43. This can be done so that a comparison can be made of measured intensity values before and after the second beam of radiation is attenuated by the variable attenuator. The controller 45 can subsequently determine, from the level of transmission of the variable attenuator to the second beam of radiation 46, the level of transmission of the variable attenuator to the beam of radiation 41 to be controlled. This determination can be based on a calculation using the known wavelengths of the two beams of radiation and the angles of incidence of each on the partial reflectors 42, 43 or can be based on calibration data.

Figure 9B:
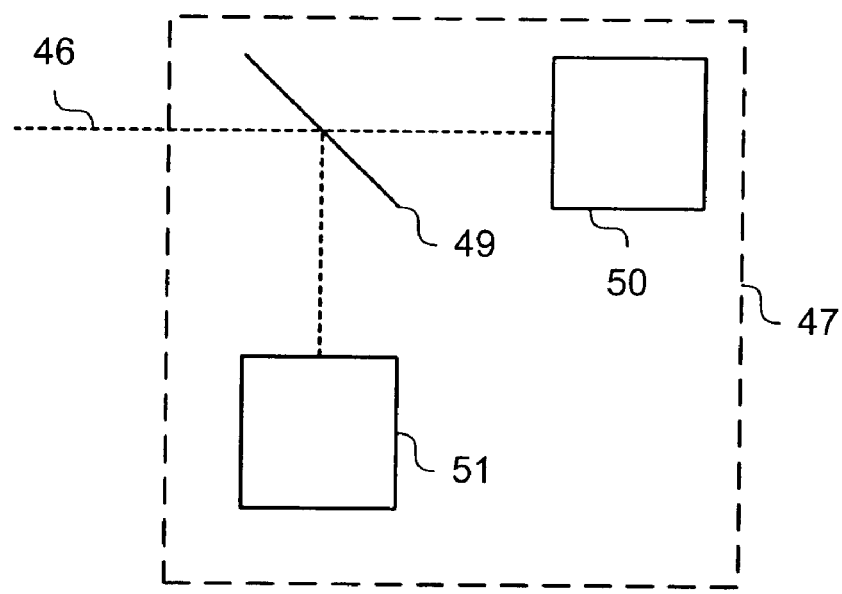
FIG. 9b depicts a detail of a variable attenuator, according to the third embodiment of the present invention.

As shown in FIG. 9b, the detector unit can comprise a partial reflector 49 that divides the second beam of radiation 46 to a first path that leads to a photodiode 50, for example, that measures the intensity of the radiation, and a CCD 51, for example, that measures the uniformity of the intensity of the radiation across the second beam of radiation 46. Accordingly, the photodiode 50 can quickly determine the intensity of the radiation, from which the controller 45 can determine the overall transmission level of the variable attenuator and, accordingly, can send control signals to the actuator system 44 to adjust the separation of the partial reflectors 42, 43, as necessary, in order to provide a required level of transmission. In addition, the CCD 51 can, more slowly, provide measurements of the uniformity of the radiation across the second beam of radiation 46 from which the controller 45 can determine corrections that should be made to adjust the relative angle of the partial reflectors 42, 43 in order to maintain the uniformity of the radiation distribution of the beam of radiation 41 being controlled by the variable attenuator.

Embodiment 4

Figure 10:
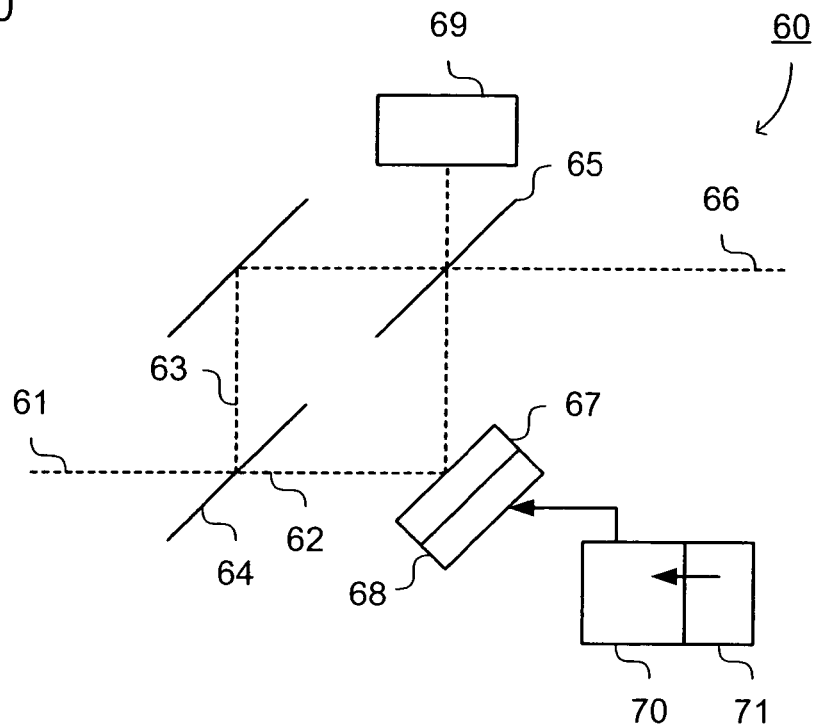
FIG. 10 depicts a fourth embodiment of a variable attenuator, according to the present invention.

FIG. 10 depicts a variable attenuator 60 according to a fourth embodiment of the present invention. In this embodiment, the beam of radiation 61 to be controlled is divided into first and second-beam paths 62, 63 by a partial reflector 64. The first and second beam paths 62, 63 are recombined by a second partial reflector 65 to provide the output beam of radiation 66. The first and second beam paths 62, 63 are recombined at the second partial reflector 65 in such a way that they interfere. A reflector 67, mounted on an actuator system 68 is provided which, by suitable movements of the reflector 67, adjusts the length of the first radiation beam path 62. By adjusting the length of the first path length 62, the radiation from the first and second radiation beam paths 62, 63 either constructively or destructively interferes, or somewhere between the two. Accordingly, the intensity of the output beam of radiation 66 can be controlled. A radiation beam dump 69 can be provided to absorb the radiation rejected by the variable attenuator 60.

This arrangement allows for adjusting the mirror to provide a difference in the path lengths of the first and second radiation beam paths 62, 63 to be an integer multiple of the wavelength of the radiation plus one half of the wavelength of the radiation. Thus, it is possible to attain a very low level of transmission of the variable attenuator to the radiation. This is because the radiation from the two radiation beam paths 62, 63 destructively interferes at the second partial reflector 65. This is desirable because, as discussed above, the minimum level of transmission attainable by the variable attenuator determines the final accuracy of the dose that is provided by a radiation dose control system in which a main pulse of radiation is followed by one or more correction pulses.

The actuator system 68 can be comprised of one or more piezoelectric actuators. Such actuators are capable of accurately and rapidly adjusting the position of the reflector 67 over the required range of movement, e.g., of the order of one quarter of the wavelength of the beam of radiation in order to adjust the path length by half the wavelength of the beam of radiation, e.g., from minimum to maximum transmission. In a manner corresponding to the first embodiment discussed above, the controller 70 can include a memory 71 that stores calibration data relating the control signals provided to the actuator system 68 to the level of transmission of the variable attenuator 60 to the beam of radiation 61.

Embodiment 5

Figure 11:
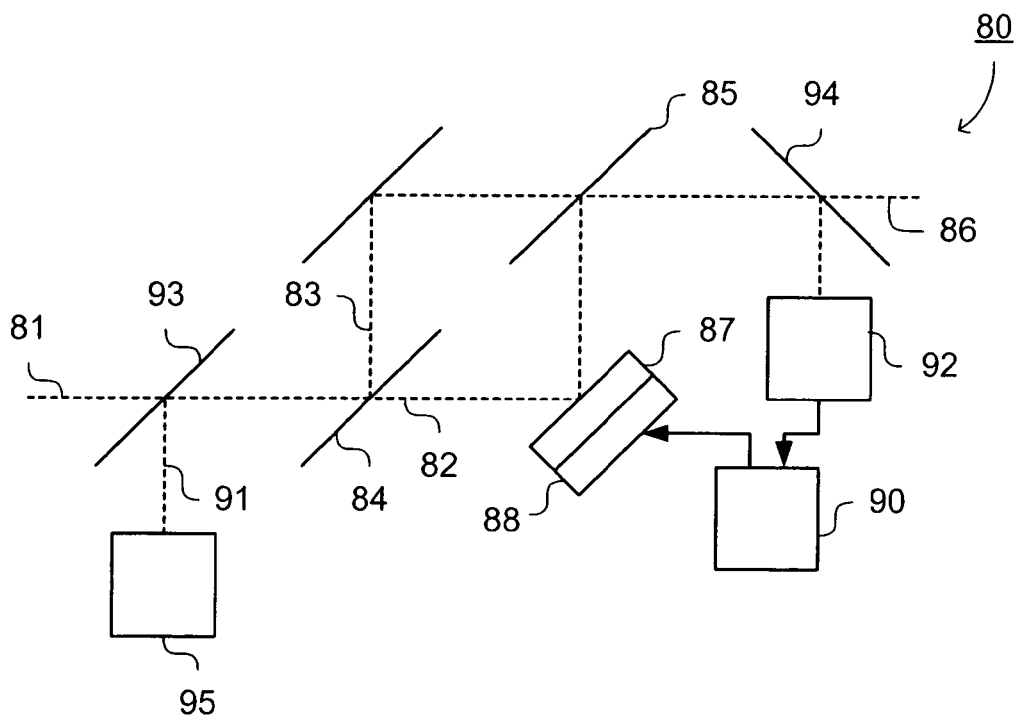
FIG. 11 depicts a fifth embodiment of the variable attenuator, according to the present invention.

FIG. 11 depicts a variable attenuator 80 according to a fifth embodiment of the present invention. The fifth embodiment corresponds to the fourth embodiment discussed above, e.g., in which the input beam of radiation 81, is divided by a first partial reflector 84 into first and second radiation beam paths 82, 83 before being recombined by a second partial reflector 85 to provide an output beam of radiation 86. As with the fourth embodiment, the path length of the first radiation beam path 82 is adjusted, for example, by means of a reflector 87, which is actuated by an actuator system 88. The difference between the fourth and the fifth embodiments lies in the arrangement for controlling the variable attenuator.

In a similar arrangement to the third embodiment, a second beam of radiation 91 is directed through the variable attenuator 80 and inspected by a radiation detector 92. Accordingly, a direct measurement can be made of the level of transmission of the variable attenuator. As with the third embodiment, a second detector can be provided to inspect the second beam of radiation 91 prior to it being directed through the variable attenuator such that the input and output intensity levels can be accurately compared.

As shown, the second beam of radiation 91 can follow the same radiation beam path as the radiation beam 81 to be controlled. In this case, reflectors 93, 94 are provided to introduce the second beam of radiation 91 to the radiation beam path of the beam of radiation 81 to be controlled and to extract it from the path of the output beam of radiation 86. As discussed above in relation to FIG. 3, the source of radiation 95 for the second beam of radiation 91 can be provided within the variable attenuator or external to it or even external to a lithographic apparatus within which the variable attenuator is used.

In any case, if a different wavelength of radiation is used for the second beam of radiation from that used for the beam of radiation 81 to be controlled, the reflectors 93, 94 used to insert and extract the second beam of radiation 91 can be selected such that they reflect radiation of the wavelength of the second beam of radiation 91 but transmit radiation of the wavelength of the beam of radiation to be controlled 81. Accordingly, the second beam of radiation can be introduced into and extracted from the beam path of the beam of radiation to be controlled 81 without interfering with it.

In an alternative arrangement, the reflectors 93, 94 used to introduce and extract the second beam of radiation 91 from the beam path of the beam of radiation 81 to be controlled can be polarizing beam splitters. The beam of radiation to be controlled 81 and the second beam of radiation 91 can be orthogonally polarized at the appropriate orientations.

As a further alternative, the second beam of radiation 91 may not precisely follow the beam path of the beam of radiation to be controlled 81, but follow a parallel path (for example displaced into or out of the plane of FIG. 11). The changes of the path length for the second beam of radiation by actuating the reflector 87 are the same as the changes in the path length for the beam of radiation to be controlled 81.

The controller 90 is configured to generate control signals for the actuator system 88 in order to control the position of the mirror 87 based on the detected intensity of the second beam of radiation 91 detected by the detector 92. It will be appreciated that the radiation detector 92 can have the same configuration as depicted in FIG. 9b, in relation to the third embodiment, such that the detector can detect not only the intensity of the second beam of radiation, but also the uniformity of the intensity of the cross-section of the second beam of radiation 91. In that case, the controller 90 can be configured additionally to provide control signals to the actuator system 88 in order to adjust the position of the mirror 87 in order to optimize the intensity uniformity of the beam of radiation.

Embodiment 6

Figure 12A:
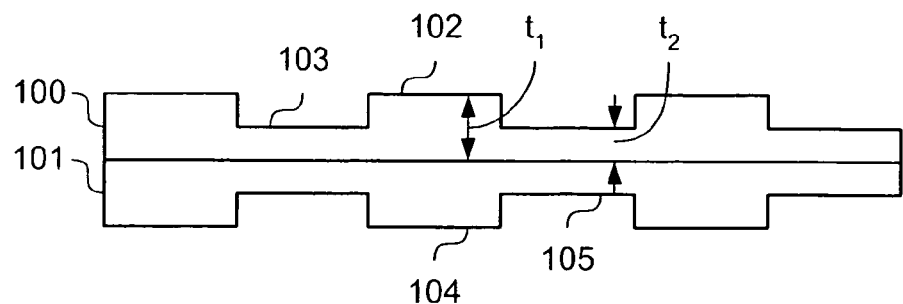
FIGS. 12a and 12b depict an operating principle of an alternative kind of variable attenuator, according to the present invention within a lithographic apparatus.

The variable attenuator of the sixth embodiment is comprised of a pair of $\lambda/4$ phase gratings. For example, phase gratings divided into a plurality of areas of a first and second type, for example having a plurality of elongate striations, and in which a phase shift induced in radiation incident on areas of the first type is a quarter of a wavelength greater or less than the phase shift induced in radiation incident on the areas of the second type. As shown in FIG. 12a, in a first phase grating 100 this can be provided by having first area 102 having a thickness t1 and second areas 103 having a smaller thickness t2. The second grating 101 has a similar structure.

The two phase gratings are arranged parallel to one another, but at least one is movably mounted such that the second phase grating can be moved relative to the first phase grating between a first position, depicted in FIG. 12a. In the first position the areas of the first type 102, 104 of the first and second phase gratings 100, 101 are aligned and the areas of the second type 103, 105 of the first and second phase gratings 100, 101 are aligned, and can be shifted to a second position, depicted in FIG. 12b. In the second position, the areas of the first type 102 of the first phase grating 100 are aligned with the areas of the second type 105 of the second phase grating 101 and the areas of the second type 103 of the first phase grating 100 are aligned with the areas of the first type 104 of the second phase grating 101. Consequently, in the first position a $\lambda/2$ phase grating is effectively created and in the second position no phase grating is formed at all because the same phase shift is introduced to all of the radiation. Accordingly, in the first position the transmission of zero order radiation through the combined phase gratings is minimized and in the second position transmission of zero order radiation through the combination of the phase gratings is maximized.

Figure 12B:
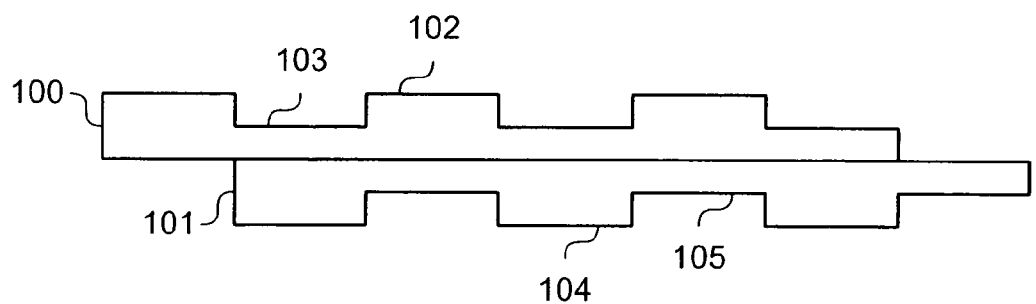
Figure 12C:
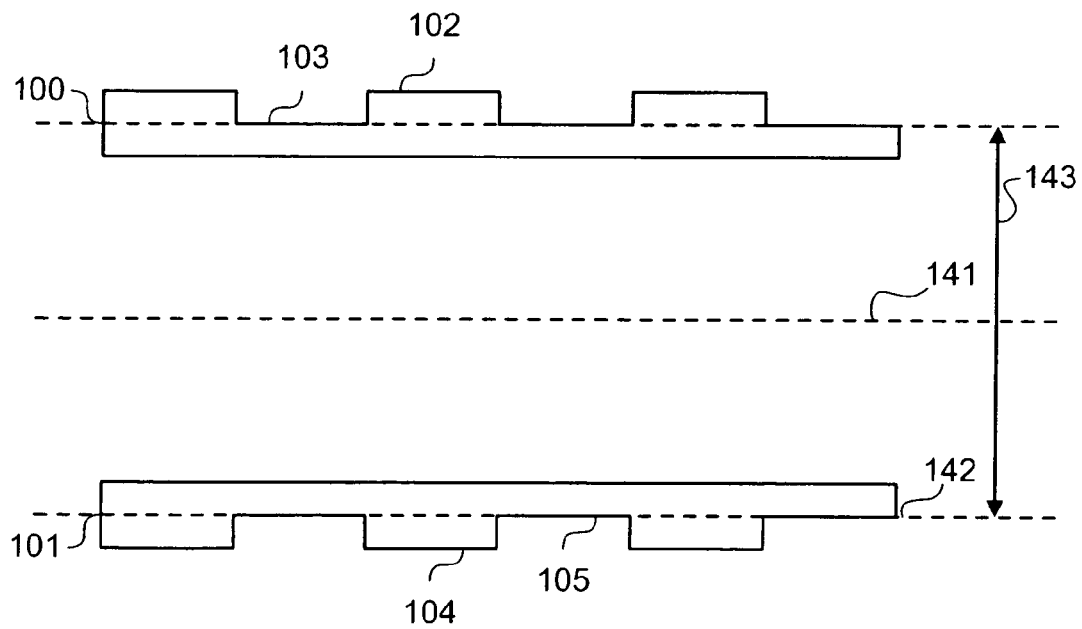
FIG. 12c depicts phase gratings separated by a Talbot spacing.

Alternatively or additionally, as illustrated in FIG. 12c, the phase gratings 100, 101 can be separated by a distance 143 so that one or both of the phase gratings 100, 101 lies in the "Talbot" 142 or "half-Talbot" 141 plane of the other. In general, Talbot planes are defined as the planes in which images of a planar periodic structure/grating are formed when the structure/grating is illuminated by a collimated beam of radiation. Half-Talbot planes are the planes halfway in between. The spacings between the planes can be referred to as Talbot spacings and half-Talbot spacings. The separation between the phase gratings 100, 101 can be air (as shown), glass or a combination of the two, for example.

FIGS. 12a-12c show phase gratings 100, 101 arranged with the parallel rear sides of the gratings. This can represent the substrate sides of the grating (i.e., the non-patterned sides), facing each other and/or in contact with each other. However, the phase gratings 100, 101 could equally be arranged so that their faces (patterned sides) face each other or are in contact, or the face of one grating can be arranged to face the rear or substrate side of the other grating. In each case, the gratings can be in contact or separated by Talbot or half-Talbot spacings.

In one example, the phase grating 100, 101 is periodic and areas 102-105 all have the same width. To facilitate manufacture, the grating period can be greater than or much greater than the wavelength of the incident radiation. Also, the illumination can be collimated with a divergence that is less than or much less than the grating diffraction angle, which is wavelength/period of grating. It can therefore be convenient to place the attenuator before the adjuster AD (FIG. 1), which increases the illumination divergence.

In an exemplary embodiment, the positions, s, of the Talbot and half-Talbot planes are given approximately by the expression $s=m\,p2/\lambda$, where s is measured from a reference grating, p is the grating periodicity, $\lambda$ is the wavelength of incident radiation, and m is an integer (1, 2, 3 ... etc.). Odd values of m represent half-Talbot planes/separations and even values of m represent full Talbot planes. For $\lambda=193$ nm and p=10 µm, s=m*518 µm for the case where the gratings are separated by an air gap. To achieve good efficiency, the gratings should be positioned within about 2 µm of the Talbot and half-Talbot planes in this example. If the gap is filled with a grating substrate material, such as glass, for example, the separations will be increased in proportion to the refractive index of the filler material.

Accordingly, as depicted in FIG. 13, the variable attenuator 110 of the sixth embodiment of the present invention comprises two $\lambda/4$ phase gratings 111, 112. The two gratings 111, 112 are arranged mutually parallel and an actuator system 113 configured to adjust the relative position of the phase gratings in order to switch them between the first and second positions discussed above in relation to FIGS. 12a and 12b. This can be done so that the level of transmission of the variable attenuator is controlled between a minimum level of transmission and a maximum level of transmission. The actuator system 113 can, for example, be comprised of a plurality of piezoelectric actuators which are capable of rapidly and accurately controlling the relative position of the two phase gratings 111, 112. Alternatively, the actuators can be electromagnetic.

In order to maintain the attainable levels of contrast, a barrier 116 with an aperture 117 can be provided that only permits zero order radiation to pass as the output beam of radiation 118 from the variable attenuator.

A lens system can be added to help separate the desired zero-order beam from the other-order beams. Although such an arrangement can add complexity, it can shorten the distance between grating 112 and stops 116.

A controller 114 is provided that generates the control signals necessary for the actuator system 113. The controller 114 can include a memory 115 that contains calibration data, relating the control signals to be provided to the actuator system 113 to the level of transmission of the variable attenuator 110 to the input beam of radiation 115.

Embodiment 7

Figure 14:
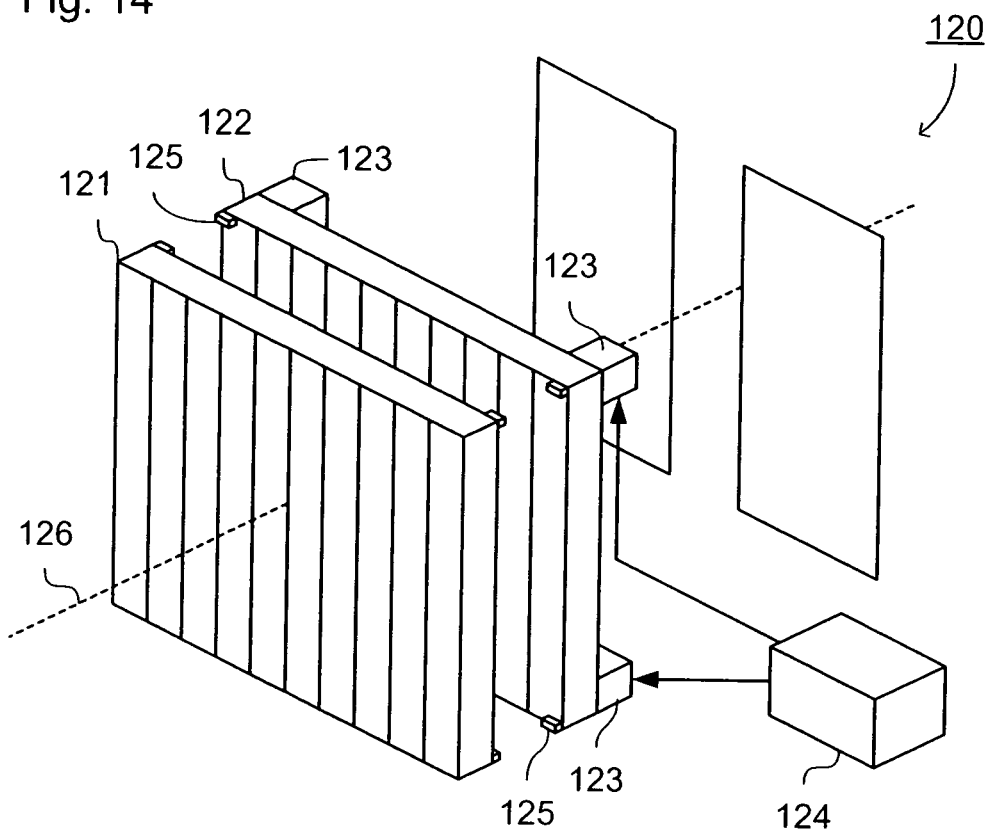
FIG. 14 depicts a seventh embodiment of a variable attenuator, according to the present invention within a lithographic apparatus.

FIG. 14 depicts a variable attenuator 120 according to the seventh embodiment of the present invention. The variable attenuator of the seventh embodiment corresponds to that of the sixth embodiment, e.g., is comprised of a pair of mutually parallel phase gratings 121, 122 and an actuator system 123 that controls the relative position of the pair of phase gratings in response to control signals provided by a controller 124.

However, the seventh embodiment of the variable attenuator includes at least one position sensor 125 that measures the actual relative position of the first and second phase gratings 121, 122. Accordingly, the controller 124 can determine a desired relative position of the phase gratings 121, 122 in order to provide a desired level of transmission of the variable attenuator 120 to the input beam of radiation 126. Subsequently it provides the control signals to the actuator system 123 necessary to minimize the difference between the desired relative position and the measured relative position.

The position sensor system can comprise one or more capacitive sensors and be configured simply to measure the relative position of the phase gratings 121, 122 in the direction of relative movement of the phase gratings necessary to switch between the first position and the second position depicted in FIGS. 12a and 12b. Additionally, however, the position sensors can monitor the separation of the phase gratings 121, 122 and/or the relative angle of the phase gratings 121, 122. Accordingly, the controller 124 can provide control signals to the actuator system 123 in order to adjust the separation of the phase gratings 121, 122 and/or the relative angle of the phase gratings 121, 122. This is beneficial because in order for the maximum and minimum levels of transmission to be provided for any of the variable attenuators of the invention that comprise two phase gratings, the phase gratings 121, 122 should be maintained as close to parallel as possible and should be very closely spaced or separated by specific distances, approximated by so-called Talbot planes or by half Talbot planes. In the latter case, the relative positions of the phase gratings 121, 122 required for maximum and minimum levels of transmission are exchanged.

Embodiment 8

Figure 15:
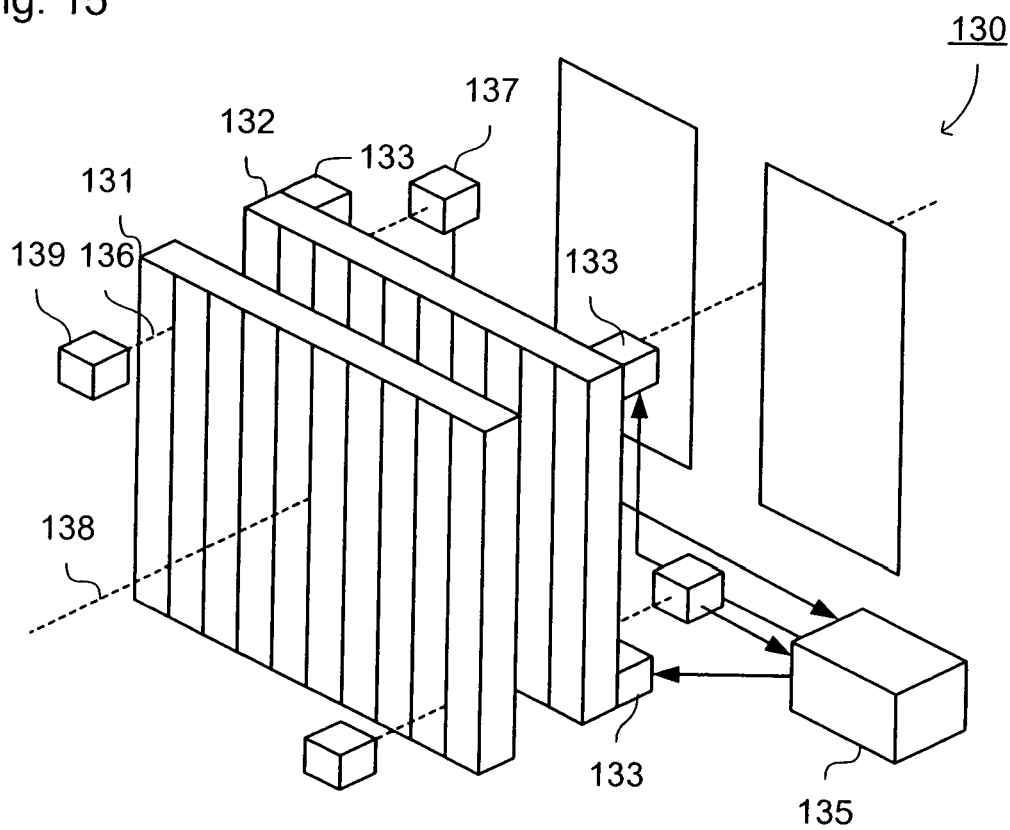
FIG. 15 depicts an eighth embodiment of a variable, according to the present invention within a lithographic apparatus.

FIG. 15 depicts an eighth embodiment of a variable attenuator 130 according to the present invention. As depicted, the eighth embodiment corresponds to the sixth and seventh embodiments of the present invention, comprising two phase gratings 131, 132, an actuator system 133 for adjusting the relative position of the phase gratings 131, 132, and a controller 135 that provides control signals to the actuator system 133.

In the eighth embodiment, a second beam of radiation 136 is directed through the phase gratings 131, 132 and inspected by a radiation detector 137. As with the previous embodiments involving a second beam of radiation, the second beam of radiation 136 can be of a different wavelength to the beam of radiation 138 to be controlled by the variable attenuator 130. Likewise, the source 139 for the second beam of radiation 136 can be arranged within the variable attenuator 130 or can be external to the variable attenuator or external to a lithographic apparatus within which the variable attenuator is used. The position of the source 139 and detector 137 can be exchanged.

The second beam of radiation 136 passes through the phase gratings 131, 132 at a separate location away from the beam of radiation 138 to be controlled. Accordingly, the second beam of radiation does not interfere with the beam of radiation to be controlled 138. The inspection of the second beam of radiation that is passed through the phase gratings 131, 132 provides a direct measurement of the level of transmission of the variable attenuator for that beam of radiation. As with previous embodiments, a second detector can be provided to inspect the radiation before it passes through the phase gratings 131, 132 to provide an accurate comparison of the intensity of the radiation before and after passing through the variable attenuator.

The controller 135 can use the data from the radiation detector 137 in order to control the actuator system 133 in order to provide the required level of transmission of the variable attenuator 130 to be beam of radiation 138 to be controlled. If the radiation of the second beam of radiation 136 is different from that of the beam of radiation to be controlled 138, then the level of transmission of the variable attenuator 130 to the second beam of radiation 136 may not directly reflect the level of transmission of the variable attenuator 130 to the beam of radiation 138 to be controlled. However, the controller 135 can be provided with a calculation module that can calculate the level of transmission of the variable attenuator 130 to the beam of radiation 138 to be controlled from the level of transmission of the variable attenuator 130 to the second beam of radiation 136. Alternatively, the controller can include a memory that contains calibration data that relates the level of transmission of the variable attenuator 130 to the second beam of radiation 136 to the level of transmission of the variable attenuator 130 to the beam of radiation 138 to be controlled.

As depicted in FIG. 15, the variable attenuator 130 can comprise a plurality of second beams of radiation arranged to pass through the phase gratings 131, 132 at different locations and corresponding detectors. By comparing the transmission levels of the variable attenuator to the second beams of radiation at different locations, the controller can determine the adjustments needed to the separation and/or relative angle of the phase gratings 131, 132, and provide the requisite control signals to the actuator system 133.

To achieve increased dynamic range and/or resolution any one or more of the above described attenuators can be arranged in series (so that the radiation to be attenuated passes through the attenuators one after another), either in the context of a lithographic apparatus or in a more general context.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g., a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A variable attenuator configured to adjust its level of transmission of an input beam of radiation in response to an input control signal that represents a desired level of transmission of the variable attenuator to the beam of radiation, comprising:
    first and second semi-transparent reflectors, arranged substantially mutually parallel and such that the beam of radiation successively passes through the first and second semi-transparent reflectors; and
    an actuator system that is configured to control the separation of the first and second semi-transparent reflectors in response to the input control signal.

2. The variable attenuator of claim 1, wherein the beam of radiation is incident on the first semi-transparent reflector at an oblique angle.

3. The variable attenuator of claim 1, further comprising a controller that is configured to provide control signals to the actuator system in order to control the actuator system in response to the input control signal.

4. The variable attenuator of claim 3, wherein:
    the controller includes a memory configured to store calibration data corresponding to a relationship between the level of transmission of the attenuator and the control signals; and
    the controller is configured to generate the control signals for the actuator system in response to the input control signal and based on the calibration data.

5. The variable attenuator of claim 3, further comprising:
    a position sensor system configured to measure the relative position of the first and second semi-transparent reflectors; and
    wherein the controller is configured to generate the control signals for the actuator system in response to the input control signal and based on the measured relative position of the first and second semi-transparent reflectors.

6. The variable attenuator of claim 5, wherein:
    the controller is configured to determine a desired relative position of the first and second semi-transparent reflectors based on the input control signal and to generate the control signals for the actuator system based on the difference between the desired and measured relative position of the first and second semi-transparent reflectors.

7. The variable attenuator of claim 5, wherein:
    the actuator system is further configured to control the relative angular position of the first and second semi-transparent reflectors; and
    the controller is configured such that it provides control signals to the actuator system to control the relative angular position of the first and second semi-transparent reflectors based on the measured relative position of the first and second semi-transparent reflectors.

8. The variable attenuator of claim 3, further comprising:
    a source of radiation configured to generate a second beam of radiation that is incident on one of the first and second semi-transparent reflectors at a different angle from that at which the first beam of radiation is incident on the first semi-transparent reflector; and
    a detector system that is configured to inspect the second beam of radiation after it has passed through the first and second semi-transparent reflectors,
    wherein the detector system is configured to measure the intensity of the second beam of radiation passing through the variable attenuator, and
    wherein the controller is configured to generate the control signals for the actuator system in response to the input control signal based on the measured intensity of the second beam of radiation.

9. The variable attenuator of claim 8, wherein:
    the detector system is further configured to measure the uniformity of the radiation intensity across a cross section of the second beam of radiation;
    the actuator system is further configured to control the relative angular position of the first and second semi-transparent reflectors; and
    the controller is configured such that it provides control signals to the actuator system to control the relative angular position of the first and second semi-transparent reflectors based on the measured uniformity of the radiation intensity across the cross section of the second beam of radiation.

10. A variable attenuator configured to adjust its level of transmission to an input beam of radiation in response to an input control signal that represents a desired level of transmission of the variable attenuator to the beam of radiation, comprising:
    a radiation beam splitter that divides the beam of radiation onto first and second radiation beam paths;
    a radiation beam combiner that re-combines radiation from the first and second radiation beam paths, such the re-combined radiation interferes and produces an output beam of radiation; and
    a radiation beam pathlength controller configured to control a pathlength of the first radiation beam path in response to the input control signal in order to control the interference of the radiation from the first and second radiation beam paths.

11. The variable attenuator of claim 10, wherein the radiation beam pathlength controller comprises a reflector and an actuator system configured to control the position of the reflector, such that the radiation beam pathlength controller can alter the pathlength of the first radiation beam path.

12. The variable attenuator of claim 11, further comprising a controller that is configured to provide control signals to the actuator system in order to control the actuator system in response to the input control signal.

13. The variable attenuator of claim 12, wherein:
the controller includes a memory configured to store calibration data corresponding to a relationship between the level of transmission of the attenuator and the control signals; and
the controller is configured to generate the control signals for the actuator system in response to the input control signal based on the calibration data.

14. The variable attenuator of claim 12, further comprising:
a source of radiation configured to generate a second beam of radiation and to direct it to the radiation beam splitter, such that the second beam of radiation is divided into the first and second beam paths and re-combined by the radiation beam combiner; and
a detector system that is configured to inspect the second beam of radiation once it has been re-combined by the radiation beam combiner;
wherein the detector system is configured to measure the intensity of the second beam of radiation, and
wherein the controller is configured to generate the control signals for the actuator system in response to the input control signal based on the measured intensity of the second beam of radiation.

15. The variable attenuator of claim 14, wherein:
the detector system is further configured to measure the uniformity of the radiation intensity across the cross section of the second beam of radiation;
the actuator system is further configured such that it can control the angle of the reflector of the radiation beam pathlength controller relative to a beam of radiation propagating through the first radiation beam path which, in turn, controls the relative angle of incidence of the radiation from the first and second radiation beam paths in the radiation beam combiner; and
the controller is configured such that it provides control signals to the actuator system to control the angle of the reflector of the radiation beam pathlength controller based on the measured uniformity of the radiation intensity across the cross section of the second beam of radiation.

16. A variable attenuator configured to adjust its level of transmission to an input beam of radiation in response to an input control signal that represents a desired level of transmission of the variable attenuator to the beam of radiation, comprising:
first and second phase gratings; and
an actuator system;
wherein the first and second phase gratings are arranged substantially mutually parallel and so that the beam of radiation is initially incident on the first phase grating and then is incident on the second phase grating;
wherein each of the phase gratings comprises a plurality of regions of a first type and a plurality of regions of a second type,
wherein the phase gratings are constructed such that, for each phase grating, a phase shift introduced to the beam of radiation passing through the regions of the first type is a quarter of a wavelength of the beam of radiation input to the variable attenuator greater than for the regions of the second type, and
wherein actuator system is configured to adjust the relative positions of the first and second phase gratings in response to the input control signal at least between a first position, in which radiation passing through regions of the first and second type of the first phase grating subsequently passes through regions of the first and second type, respectively, of the second phase grating, and a second position, in which radiation passing through regions of the first and second type of the first grating subsequently passes through regions of the second and first type, respectively, of the second phase grating.

17. The variable attenuator of claim 16, wherein:
zero order radiation that has passed through the first and second phase gratings is directed as an output of the variable attenuator; and
the variable attenuator comprises at least one radiation dump to which higher positive or higher negative orders, or both, of radiation that has passed through the first and second phase gratings are directed.

18. The variable attenuator of claim 16, further comprising a controller that is configured to provide control signals to the actuator system in order to control the actuator system in response to the input control signal.

19. The variable attenuator of claim 18, wherein:
the controller includes a memory configured to store calibration data corresponding to the relationship between the transmission level of the attenuator and the control signals; and
the controller is configured to generate the control signals for the actuator system in response to the input control signal and based on the calibration data.

20. The variable attenuator of claim 18, further comprising:
a position sensor system configured to measure the relative position of the first and second phase gratings; and
wherein the controller is configured to generate the control signals for the actuator system in response to the input control signal and based on the measured relative position of the first and second phase gratings.

21. The variable attenuator of claim 20, wherein the controller is configured to determine a desired relative position of the first and second phase gratings based on the input control signal and to generate the control signals for the actuator system based on the difference between the desired and measured relative position of the first and second phase gratings.

22. The variable attenuator of claim 20, wherein:
the actuator system is further configured to control a relative angular position of the first and second phase gratings; and
the controller is configured such that it provides control signals to the actuator system to control the relative angular position of the first and second phase gratings based on the measured relative position of the first and second phase gratings.

23. The variable attenuator of claim 18, further comprising:
a source of radiation configured to generate a second beam of radiation that is directed to pass through the first and second phase gratings at a location different from the first beam of radiation; and
a radiation detector configured to detect intensity of zero order radiation derived from the second beam of radiation that has passed through the first and second phase gratings,
wherein the controller is configured to generate the control signals for the actuator system in response to the input control signal based on the intensity measured by the radiation detector.

24. The variable attenuator of claim 23, wherein:
the source of radiation and the radiation detector form a first sensor for providing information to the controller related to the relative position of the first and second phase gratings;
the variable attenuator comprises at least one further sensor corresponding to the first sensor generating a corresponding beam of radiation that passes through the first and second phase gratings at a location different from the first and second beams of radiation; and the controller is configured to generate the control signals for the actuator system in response to the input control signal based on the information provided by the sensors.

25. The variable attenuator of claim 16, wherein the second phase grating is separated from the first phase grating and lies in a Talbot plane of the first grating or a half-Talbot plane of the first grating.

26. A lithographic apparatus, comprising:
an illumination system configured to condition a pulsed beam of radiation;
a variable attenuator configured such that it attenuates the intensity of at least one pulse of the pulsed beam of radiation, wherein the variable attenuator comprises one of,
   a) two semi-transparent reflectors and a path length controller,
   b) a beam splitter, a beam combiner, and a path length controller, or
   c) two phase gratings and a path length controller, and
a control system, configured to determine a desired intensity of a pulse of radiation and to provide a control signal to the variable attenuator, corresponding to a desired level of transmission of the variable attenuator to the beam of radiation, necessary to attenuate the pulse to the desired intensity.

27. The lithographic apparatus of claim 26, comprising a plurality of the variable attenuators arranged in series.

28. A device manufacturing method, comprising:
forming a variable attenuator using first and second semi-transparent reflectors that are arranged substantially mutually parallel, such that a pulsed beam of radiation successively passes through the first and second semi-transparent reflectors;
controlling separation of the first and second semi-transparent reflectors in response to an input control signal;
attenuating an intensity of at least one pulse of the pulsed beam of radiation using the variable attenuator, which is configured to adjust its level of transmission to an input beam of radiation in response to the input control signal, which represents a desired level of transmission of the variable attenuator to the beam of radiation;
modulating a pulsed beam of radiation; and
projecting the modulated beam onto a substrate.

29. A device manufacturing method, comprising:
forming a variable attenuator using a radiation beam splitter that divides a pulsed beam of radiation into first and second radiation beam paths and a radiation beam combiner that re-combines radiation from the first and second radiation beam paths such that it interferes and produces an output beam of radiation;
using a radiation beam pathlength controller to control the pathlength of the first radiation beam path in response to an input control signal in order to control the interference of the radiation from the first and second radiation beam paths;
attenuating intensity of at least one pulse of the pulsed beams of radiation using the variable attenuator that is configured to adjust its level of transmission to an input beam of radiation in response to the input control signal, which represents a desired level of transmission of the variable attenuator to the beam of radiation;
modulating the pulsed beam of radiation from the variable attenuator; and
projecting it onto a substrate.

30. A device manufacturing method, comprising:
forming a variable attenuator from first and second phase gratings that are arranged substantially mutually parallel, such that a pulsed beam of radiation is initially incident on the first phase grating and, having passed through the first phase grating, is incident on the second phase grating;
forming a plurality of regions of a first type and a plurality of regions of a second type on each of the phase gratings;
constructing the phase gratings such that, for each phase grating, a phase shift introduced to the pulsed beam of radiation passing through the regions of the first type is a quarter of the wavelength of the beam of radiation input to the variable attenuator greater than for the regions of the second type;
adjusting the relative positions of the first and second phase gratings in response to an input control signal at least between a first position, in which the radiation passing through regions of the first and second type of the first phase grating subsequently passes through regions of the first and second type, respectively, of the second phase grating, and a second position, in which radiation passing through regions of the first and second type of the first grating subsequently passes through regions of the second and first type, respectively, of the second phase grating;
attenuating intensity of at least one pulse of the pulsed beam of radiation using the variable attenuator configured to adjust its level of transmission to an input beam of radiation in response to the input control signal, which represents a desired level of transmission of the variable attenuator to the beam of radiation, comprising; and
modulating the pulsed beam of radiation; and
projecting the modulated beam onto a substrate.

* * * * *